United States Patent [19]

Gates

[11] Patent Number: 5,796,121
[45] Date of Patent: Aug. 18, 1998

[54] THIN FILM TRANSISTORS FABRICATED ON PLASTIC SUBSTRATES

[75] Inventor: Stephen McConnell Gates, Ossining, N.Y.

[73] Assignee: International Business Machines Corporation, Armonk, N.Y.

[21] Appl. No.: 823,844

[22] Filed: Mar. 25, 1997

[51] Int. Cl.$^6$ .......................... H01L 29/786; H01L 27/12
[52] U.S. Cl. .................. 257/59; 257/40; 257/60; 257/506
[58] Field of Search ............... 257/59, 60, 72, 257/506, 40

[56] References Cited

U.S. PATENT DOCUMENTS

| | | | |
|---|---|---|---|
| 4,432,131 | 2/1984 | Sadamasa et al. | 257/506 |
| 5,032,883 | 7/1991 | Wakai et al. | 257/72 |
| 5,289,016 | 2/1994 | Noguchi | 257/72 |
| 5,371,398 | 12/1994 | Nishihara | 257/72 |
| 5,409,851 | 4/1995 | Oh | 257/59 |
| 5,563,424 | 10/1996 | Yang et al. | 257/40 |
| 5,574,291 | 11/1996 | Dodabalapur et al. | 257/40 |
| 5,614,731 | 3/1997 | Uchikoga et al. | 257/59 |
| 5,625,199 | 4/1997 | Baumbach et al. | 257/59 |
| 5,641,974 | 6/1997 | Den Boer et al. | 257/72 |

*Primary Examiner*—Gene M. Munson
*Attorney, Agent, or Firm*—Stephen S. Strunck

[57] ABSTRACT

A thin film transistor is described incorporating a gate electrode, a gate insulating layer, a semiconducting channel layer deposited on top of the gate insulating layer, an insulating encapsulation layer positioned on the channel layer, a source electrode, a drain electrode and a contact layer beneath each of the source and drain electrodes and in contact with at least the channel layer, all of which are situated on a plastic substrate. By enabling the use of plastics having low glass transition temperatures as substrates, the thin film transistors may be used in large area electronics such as information displays and light sensitive arrays for imaging which are flexible, lighter in weight and more impact resistant than displays fabricated on traditional glass substrates. The thin film transistors are useful in active matrix liquid crystal displays where the plastic substrates are transparent in the visible spectrum. Enablement of the use of such plastics is by way of the use of polymeric encapsulation films to coat the surfaces of the plastic substrates prior to subsequent processing and the use of novel low temperature processes for the deposition of thin film transistor structures.

38 Claims, 7 Drawing Sheets

THIN FILM TRANSISTORS FABRICATED ON PLASTIC SUBSTRATES

FIELD OF INVENTION

Generally, this invention relates to thin film transistors especially as used in large area electronics such as information displays and light sensitive arrays for imaging. More particularly, this invention relates to thin film transistors fabricated on plastic substrates thus providing displays that are flexible, lighter in weight and more impact resistant than displays fabricated on traditional glass substrates.

CROSS-REFERENCE

The invention disclosed and claimed herein is related to the invention disclosed and claimed in application Serial No. (YO997-081; Low Temperature Process for Making Electronic Device Structures) which was filed on the same date as this application and is assigned to the same assignee as the instant invention.

BACKGROUND OF THE INVENTION

Thin film transistors (TFTs) are used in many applications of large area electronics such as information displays and light sensitive arrays for imaging. In displays and imaging arrays, the TFT is used as a switch. The most common application is the active matrix liquid crystal display (AMLCD) which is the preferred display in laptop computers. In such a display, an array of display elements may be interconnected together with TFTs via horizontal and vertical bus bars. For example, the gates of one row of the plurality of TFTs in such displays are connected to a horizontal bus bar while the sources are connected to the vertical bus bars. When a voltage is applied to a predetermined horizontal bus bar and a predetermined vertical bus bar, the gate source and drain which form a particular TFT are energized. In the case of a liquid crystal display, that part of the liquid crystal which corresponds to the energized transistor becomes transparent and light from a source in back of the display is permitted to pass through.

More particularly, in an active matrix display, the TFT switches current on and off. When on, current flows to charge a capacitor associated with an individual pixel of the display to a desired voltage. When off, the capacitor is isolated and the selected charge remains until the next time the pixel is addressed. The voltage level determines the amount of light that is transmitted through the liquid crystal associated with the pixel (i.e., determines the grey level). In light imaging arrays (sensors), the TFT also switches current on and off. When off, charge is built up on a capacitor from a light sensitive diode (more light, more charge). When the TFT is on, the built-up charge is read out to the addressing circuit. The amount of the charge determines the intensity (i.e., grey level). In a different design of imaging array, the TFT is used to address a photosensitive resistor. Chemical sensors based on TFT's have also been described.

Figure 1A:
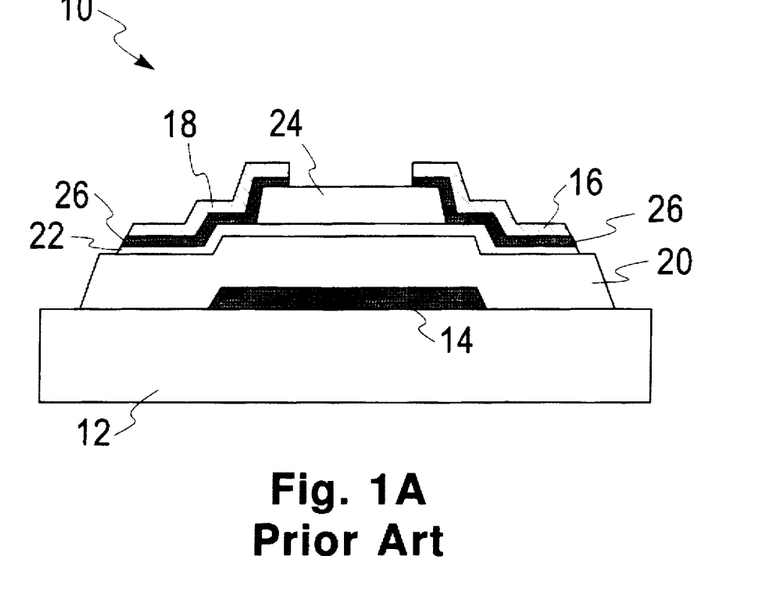
FIG. 1A shows an "etch-stopper" TFT of the prior art in cross-section.

Two common TFT structures are shown in FIG. 1. Referring to FIG. 1A, TFT 10 has the "etch stopper" structure and is made on glass plate 12. Gate metal 14 applies the gate voltage across gate dielectric 20. Current flows in channel layer 22 (amorphous or polycrystalline silicon) between source electrode 16 and drain electrode 18 through contact layers 26. Passivating insulator 24 isolates source 16 and drain 18 and prevents atmospheric degradation.

Figure 1B:
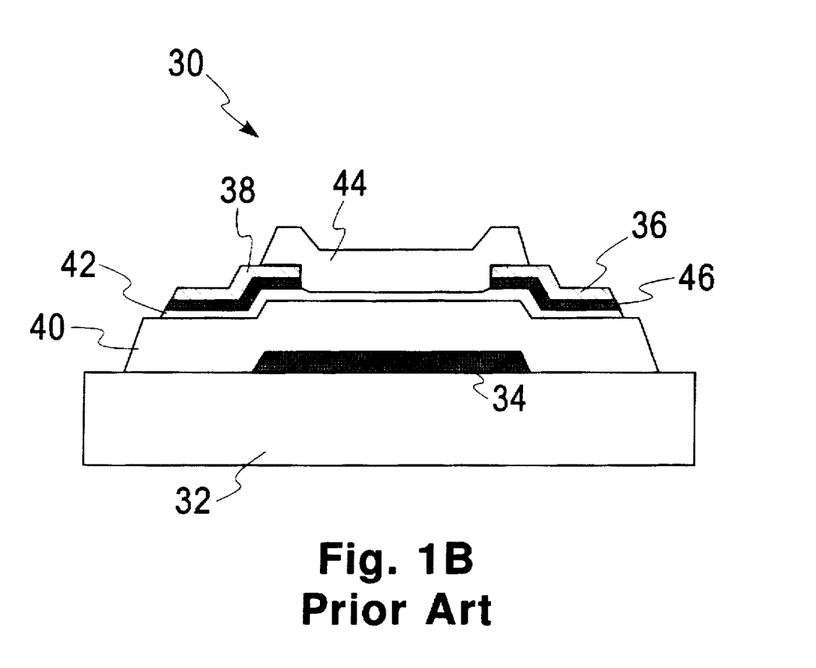
FIG. 1B shows a "back channel cut" TFT of the prior art in cross-section.

In FIG. 1B, TFT 30 has the "back channel cut" structure and is made on glass plate 32. Gate metal 34 applies the gate voltage across gate dielectric 40. Current flows in channel layer 42 (amorphous or polycrystalline silicon) between source electrode 36 and drain electrode 38 through contact layers 46. Passivating insulator 44 isolates source 36 and drain 38 and prevents atmospheric degradation.

Heretofore, the displays and photosensors described above have been fabricated on glass substrates and processing temperatures between about 250°–400° C. are required. For example, SiNitride layers 20, 24, 40 and 44 and a-Si:H layers 22, 42 are typically deposited by plasma enhanced chemical vapor deposition (PE CVD) and the deposition temperature typically exceeds 250° C. during the PE CVD steps. Hence, only flat information systems that are relatively heavy and fragile have been possible. It would be beneficial if displays could be made lighter in weight, impact (shatter) resistant, and flexible. Curved displays would allow the user to experience a "virtual reality" environment without wearing a display device on the user's head, while curved photosensors would allow detection of a digital image from many directions at one time without moving the sensor array. Impact resistant and light weight displays are key enabling devices for truly portable information products such as laptop computers and personal navigation systems.

Larger and larger glass sheets are being introduced in the manufacture of active matrix liquid crystal displays (AMLCDs) in order to reduce the cost per display by making several displays at one time. The cost of manufacturing AMLCDs would be reduced significantly if thin plastic substrates and continuous roll-to-roll manufacturing methods could be used.

Fabrication of a TFT on a plastic substrate requires solutions to the following problems. Commercially available transparent plastics are dissolved, softened or attacked by many of the standard chemicals used to fabricate semiconductor devices. Thus, the plastic substrate must be made resistant to strong acids (including HF), bases, and hydrocarbon solvents. Inexpensive clear plastics soften or decompose at the standard processing temperatures for TFT fabrication which are typically between about 250°–350° C. Since all plastics have a coefficient of thermal expansion (CTE) typically 10 times that of glass, multilayer TFT structures built on plastic are prone to delamination at standard processing temperatures due to thermal expansion of the substrate.

Solutions to those problems have not heretofore been advanced. The present invention provides solutions to the above problems and discloses three exemplary TFT structures on plastic substrates.

SUMMARY OF THE INVENTION

A thin film transistor is described incorporating a gate electrode, a gate insulating layer, a semiconducting channel layer deposited on top of the gate insulating layer, an insulating encapsulation layer positioned on the channel layer, a source electrode, a drain electrode and a contact layer beneath each of the source and drain electrodes and in contact with at least the channel layer, all of which are situated on a plastic substrate. By enabling the use of plastics having low glass transition temperatures as substrates, the thin film transistors may be used in large area electronics such as information displays and light sensitive arrays for imaging which are flexible, lighter in weight and more impact resistant than displays fabricated on traditional glass substrates. The thin film transistors are useful in active matrix liquid crystal displays where the plastic substrates are transparent in the visible spectrum.

Enablement of the use of such plastics is by way of the use of polymeric encapsulation films to coat the surfaces of the plastic substrates prior to subsequent processing and the use of novel processes for the deposition of thin film transistor structures.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

Figure 2:
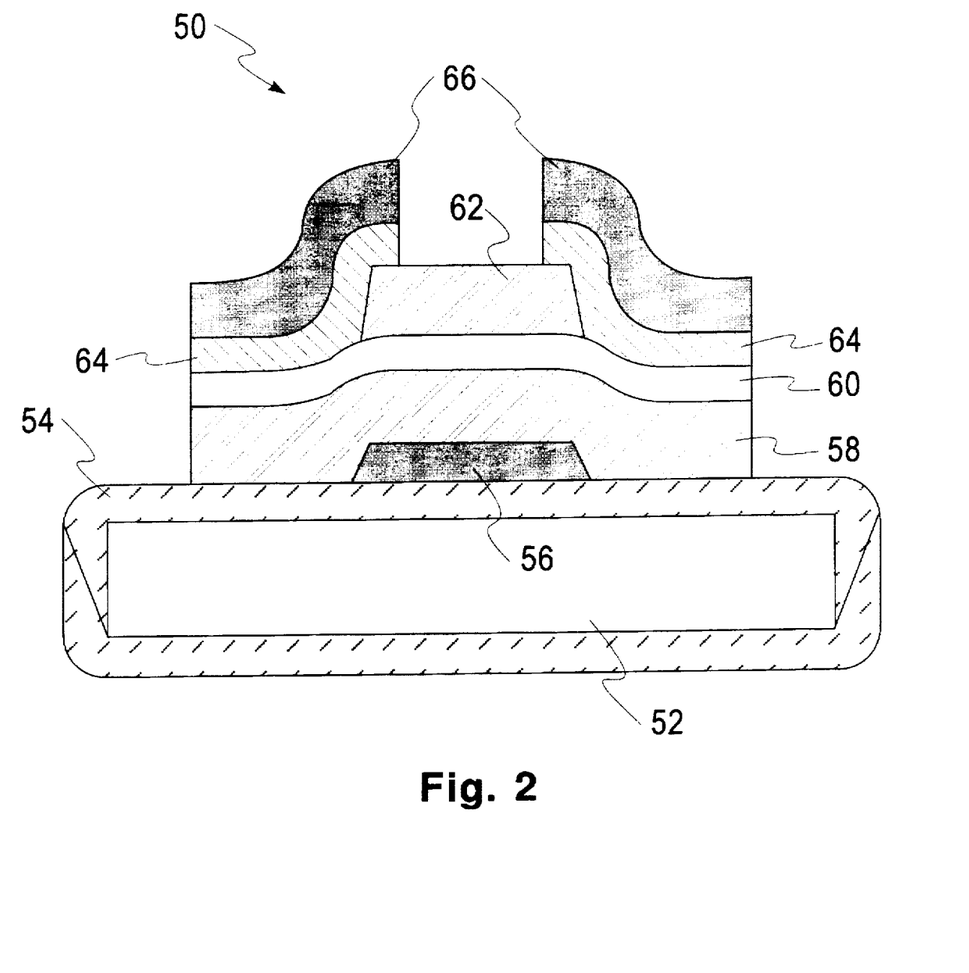
FIG. 2 shows an "etch-stopper" TFT of the invention in cross-section.

By means of the present invention, it is now possible to fabricate TFT structures on plastic substrates. FIG. 2 shows an inverted, staggered "etch-stopper" TFT structure 50 fabricated on plastic substrate 52. Protecting the plastic is an amorphous encapsulation film 54, which covers the top, bottom and edges of substrate 52. Suitable plastics for 52 are polycarbonates such as LEXAN® available from GE Plastics and cyclic olefin copolymers such as TOPAS™ available from Hoechst Celanese or Zeonex® available from BF Goodrich. Such clear plastics (i.e., having ≧90% transmission throughout the visible light spectrum) have glass transition temperatures ($T_g$) between about 120° and 200° C. For those materials which also have a melting temperature (e.g., semi-crystalline plastics), the melting temperature is higher than the glass transition temperature. In any case, these temperatures are low compared to the glass transition temperature of ordinary borosilicate window glass ($T_g \approx 600°–700°$ C.) and enablement of the use of plastics having low glass transition temperatures is an innovation of the instant invention. Opaque plastics, which may have glass transition temperatures above about 200° C. are also enabled by the invention. These, too, are characterized as having a low glass transition temperature especially compared to borosilicate window glass, for example.

Encapsulation film 54 must possess all of the following characteristics. It must be electrically insulating, transparent in the visible spectrum (for AMLCDs), be resistant to attack by processing chemicals, including strong acids, strong bases, and solvents, be resistant to scratching, be smooth and pin-hole free and adhere well to the plastic substrate during thermal cycling to about 125°–150° C. It has been found that thermally cured SHC 1200 Hard Coat and ultraviolet cured UVHC 8558 Hard Coat available from GE Silicones and Vitrinite™, available from Metroline Industries, Inc. possess the above-mentioned characteristics. It has also been found that use of GE Silicones SHP 401 primer to prepare the substrate before application of the Hard Coat provides best adhesion of the GE Silicones Hard Coat. Encapsulation film 54 may be applied by dipping or spin coating (GE Silicones Hard Coats) or by vacuum coating (Vitrinite).

In FIG. 2, gate metal layer 56 (gate electrode) is deposited and patterned. Acceptable metals for forming the gate electrode are Cr, Ta, Mo, W, and Cu and alloys thereof; Cr is generally presently preferred. Layered structures (tri-layers) of Cr/M/Cr, where M is a metal selected from the foregoing list are also useable; aluminum clad with chromium (Cr/Al/Cr) is generally presently preferred. Tri-layers of Ti/M/Ti are also useable. Substrate 52 with encapsulation film 54 containing gate metal 56 is placed in a reactor and layers 58, 60 and 62 are deposited in sequence. Layer 58 is the gate dielectric (insulating layer), preferably amorphous SiNitride, and is deposited at or above 125° C. by the preferred SiNitride PE CVD process of the invention described below. Layer 60 is a semiconducting channel layer, here hydrogenated amorphous Si (a-Si:H), and is deposited at or above 125° C. by the preferred a-Si:H PE CVD process of the invention described below.

Layer 62 is an insulating encapsulation layer of amorphous SiNitride which may be deposited by the same PE CVD process used to form layer 58. Layer 62 is then patterned lithographically. Contact layer 64 is then deposited. Contact layer 64 is an n-type semiconductor, preferably a-Si:H doped with phosphorus, and is made by a suitable process such as PE CVD. Alternatively, layer 64 can be a low work function metal such as magnesium or yttrium. Layer 66, a metal thin film wire such as aluminum, chromium or tantalum is then deposited by evaporation or sputtering. Layers 64 and 66 are then patterned lithographically. A passivation layer (not shown) may be added over the top of device 50.

Figure 3:
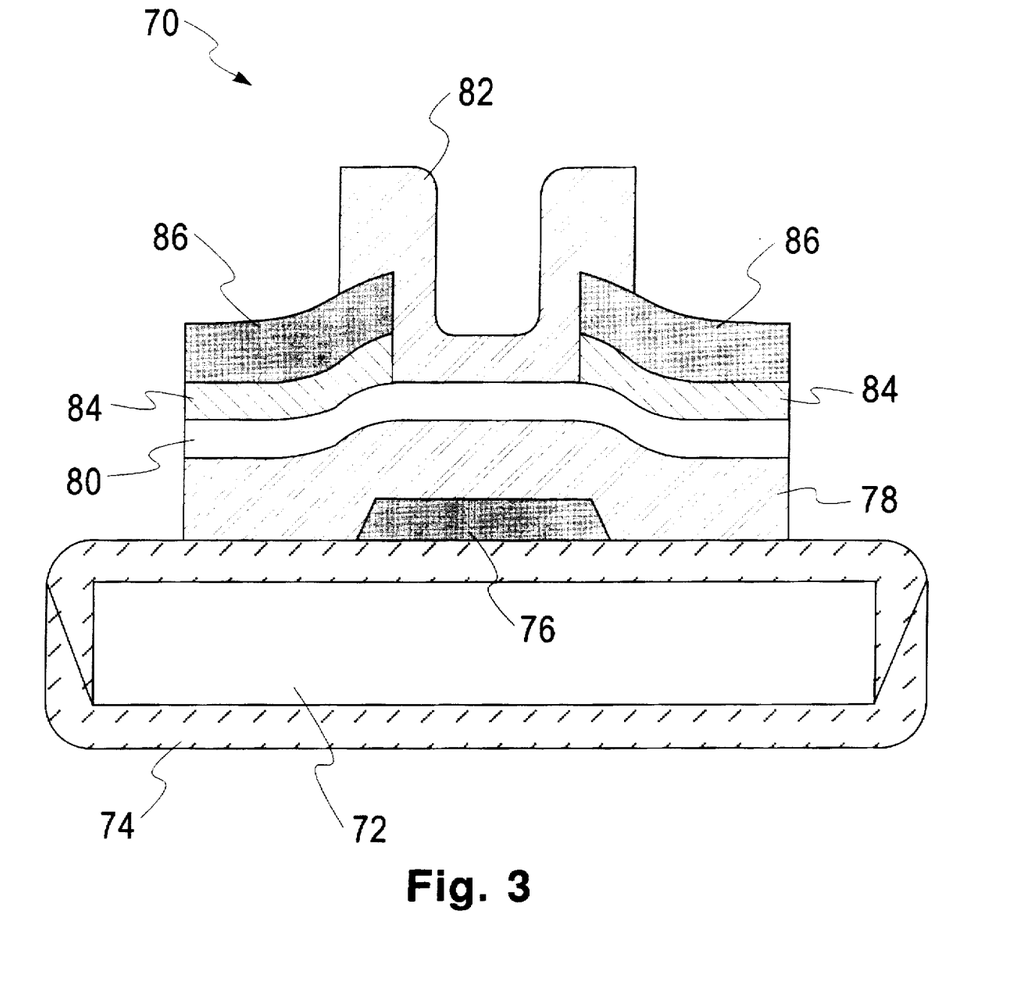
FIG. 3 shows a "back channel cut" TFT of the invention in cross-section.

A second structure 70, a back channel cut TFT, is shown in FIG. 3. Layers 72, 74, 76, 78, 80, 84, and 86 are made of the same materials and by the same processes as layers 52, 54, 56, 58, 60, 64 and 66, respectively, of device 50 discussed above. Layer 82, an insulating encapsulation layer, is deposited and patterned after layers 84 and 86 are deposited and patterned lithographically to expose layer 86. A passivation layer (not shown) may be deposited over the top of device 70.

Figure 4:
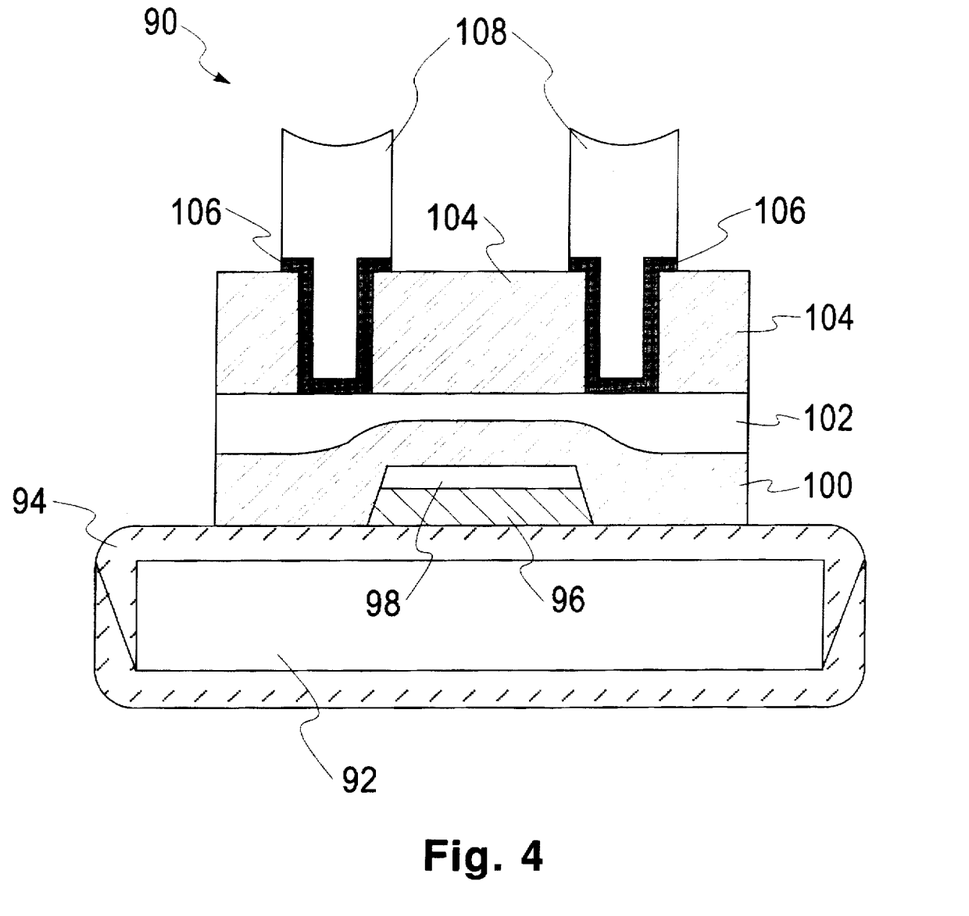
FIG. 4 shows in cross-section an inverted, staggered "etch stopper" TFT of the invention having conducting polymer electrodes.

FIG. 4 shows inverted, staggered "etch-stopper" TFT 90 having conducting polymer electrodes fabricated on clear plastic substrate 92. Protecting the plastic is an amorphous encapsulation film 94, which covers the top and bottom surfaces and the sides.

In FIG. 4, gate layer 96 (gate electrode) is a conducting polymer. Examples of suitable conducting polymer gate materials for layer 96 are polyaniline, polyacetylene and polyphenylenevinylene. Polymer gate 96 is protected during processing by layer 98. Preferred materials for this protective layer are doped N-type a-Si:H having a resistivity of not more than about 1000 ohm-cm, preferably about 10–100 ohm-cm, or a thin chromium layer. Layer 98 must be thin, conducting and mechanically robust. Substrate 92 plus layers 94, 96, 98 is placed in a suitable reactor and layers 100, 102, 104 are deposited in sequence. Layer 100 is the gate dielectric, preferably amorphous SiNitride which is deposited at about 125° C. by the same process as that used to make layer 58. Layer 102 is a-Si:H channel layer which is deposited at about 125° C. by the same process used to form layer 60.

Layer 104 is an insulating encapsulation layer and may be deposited by the same PE CVD process used to form layer 100. Layer 104 is then patterned lithographically. Contact layer 106 is then deposited. Layer 106 is an n-type semiconductor, preferably a-Si:H doped with phosphorus, and is made by a suitable deposition process such as PE CVD. Alternatively, layer 106 can be a low work function metal such as magnesium or yttrium. Layer 108, a conducting polymer, is then deposited by a spin-on or dip coating process followed by evaporation of the solvent in the polymer. Layers 106 and 108 are then patterned lithographically.

The dielectric layers in FIGS. 2, 3, 4 are numbered 58 and 62, 78 and 82, and 100 and 104, respectively. These films must be insulating and must be characterized by leakage current density of less than about $1 \times 10^{-8}$ Amps/cm$^2$ and breakdown electric field of greater than 5 MV/cm. Furthermore, these films must be deposited at process temperatures of less than 150° C., and preferably at about 125° C. or lower. One suitable process is the low temperature SiNitride PE CVD process of the invention described below.

The amorphous Si layers in FIGS. 2, 3, 4 are numbered 60, 80, and 102, respectively. These films must be semiconducting with mid-gap defect densities of order 10$^{16}$/cm$^3$, or less. Furthermore, these films must be deposited at process temperatures of less than 150° C., and preferably at about 125° C. or lower. One suitable process is the special low temperature a-Si:H PE CVD process described below.

Figure 5:
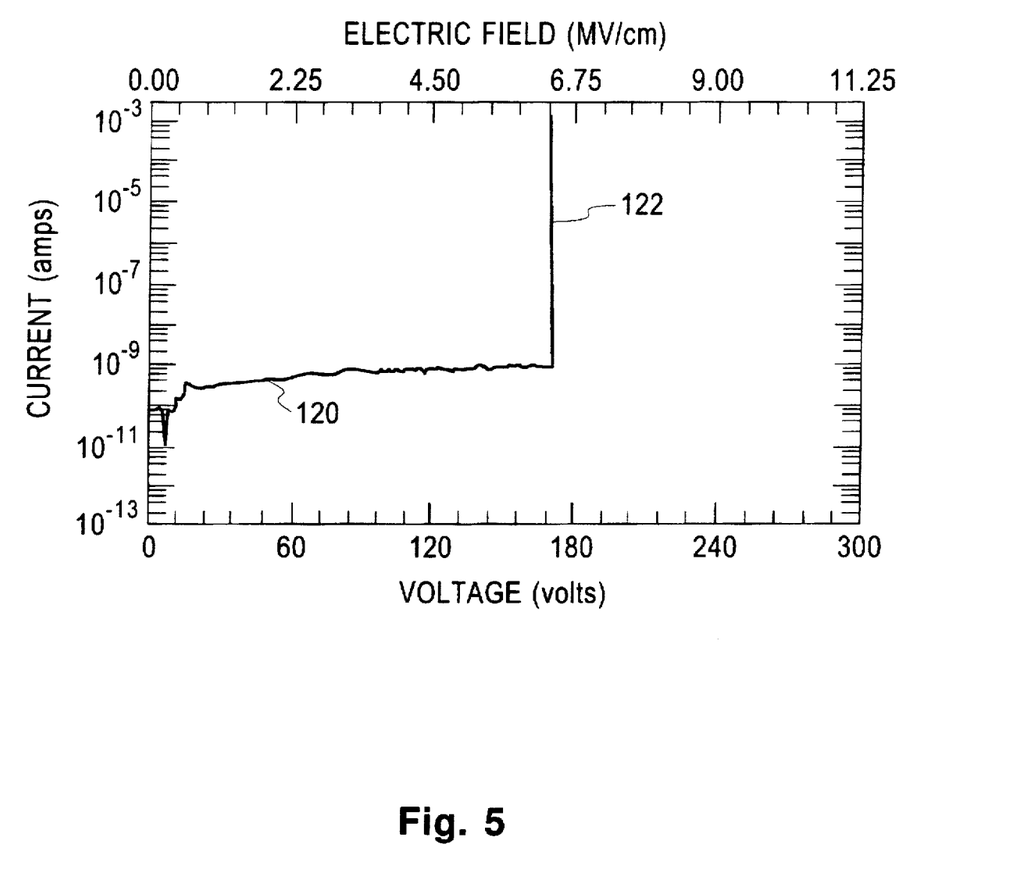
FIG. 5 is a graph of current versus voltage for an aluminum gate capacitor of area 0.053 cm$^2$ with a 2,670 Angstrom thick SiNitride layer.

A novel plasma enhanced chemical vapor deposition (PE CVD) process to deposit dielectric layers 58, 62, 78, 82, 100 and 104 is the following SiNitride process. The dielectric may be an amorphous Si, N, H alloy. The preferred process is to place the plastic substrate containing the patterned gate layer in a reactor at a temperature of 125° C. in a gas mixture at a pressure in the range 0.1 to 1 Torr, the optimum pressure being 0.6 Torr. The gas mixture contains helium, nitrogen, ammonia and silane and the total gas flow is between about 500–2000 sccm with the optimum being about 875 sccm. For He/silane the flow ratio is between about 20/1 to 100/1, preferably about 60/1; for nitrogen/silane it is between about 15/1 to 25/1, preferably about 20/1; and for ammonia/silane it is between about 1.2/1 to 2/1, preferably about 1.5/1. The preferred RF Power/area is about 0.05 Watts/cm$^2$, and may be in the range 0.03 to 0.1 Watts/cm$^2$. Aluminum gate capacitor structures (here Al/SiNitride/Al) having a SiNitride dielectric film 2,670 Angstroms thick were made using this process. These capacitors exhibited a breakdown field of 6.4 MV/cm, and leakage current at 1.1 MV/cm field of $6 \times 10^{-9}$ Amps/cm$^2$. FIG. 5 shows the leakage current, curve 120, and the current breakdown, curve 122, at 6.4 MV/cm for these capacitors. These data show that this novel low temperature PE CVD process is capable of depositing SiNitride having dielectric characteristics equivalent to those made by higher temperature PE CVD processes utilizing different gas mixtures and other process parameters.

Figure 6:
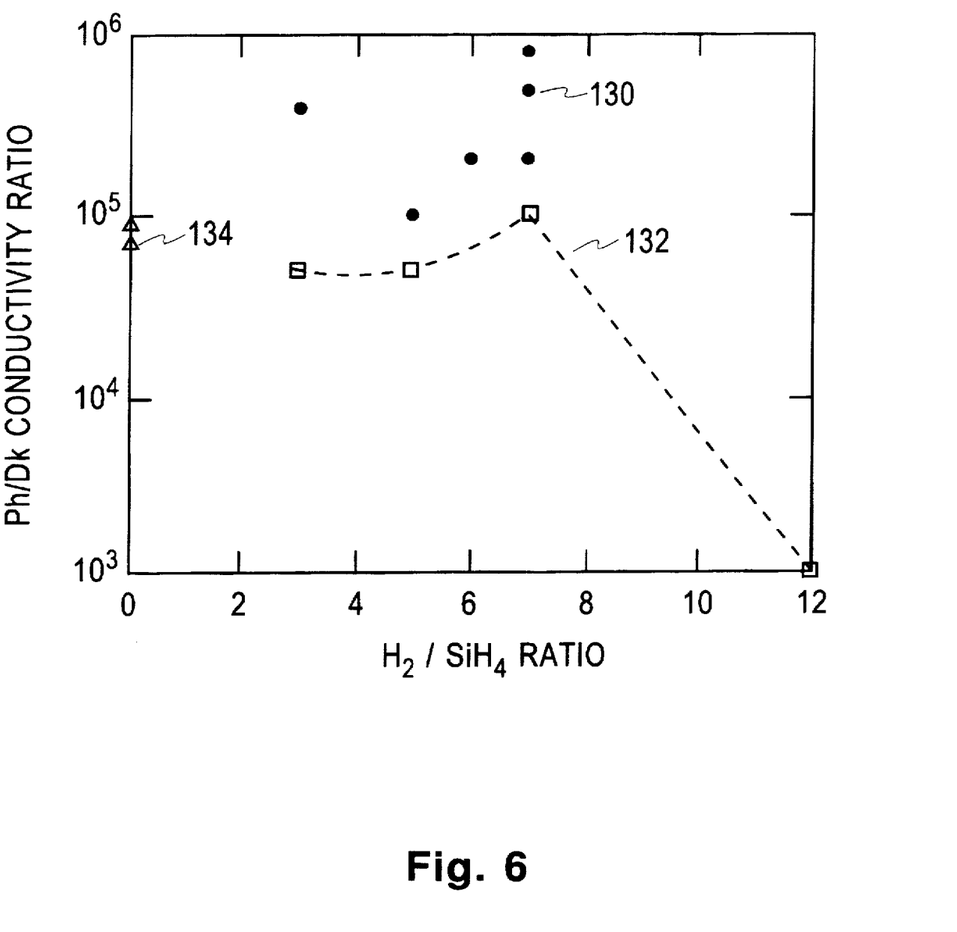
FIG. 6 is a graph of the conductivity ratio (light/dark) of an a-Si:H layer plotted versus the $H_2/SiH_4$ ratio in the PE CVD reactor.

A novel PE CVD process to deposit the a-Si:H channel layers 60, 80 and 102 is as follows. The preferred process is to place the plastic substrate in a reactor at a temperature of 125° C. and in a gas mixture at a pressure in the range 0.5 to 1.5 Torr, the optimum pressure being 1.0 Torr. The gas mixture contains He, hydrogen, and silane and the total gas flow is in the range of about 300–500 sccm, preferably about 350 sccm. For He/silane, the flow ratio is between about 10/1 to 50/1, preferably 20/1 and for hydrogen/silane it is between about 3/1 to 8/1, preferably 7/1. The preferred RF Power/area is about 0.03 Watts/cm$^2$ and may be in the range 0.02 to 0.05 Watts/cm$^2$. The resulting a-Si:H layers exhibit an optical gap of 1.85 eV, a refractive index of 3.86 and a hydrogen content of 20% with only monohydride bonding as characterized by infrared absorption spectroscopy and exhibit a ratio of photo/dark conductivity consistently >100,000. Both of these measurements are unchanged with several months time. FIG. 6 shows the ratio of photo/dark conductivity plotted vs. hydrogen/silane ratio. The photoconductivity was measured with a light fluence of about 0.1 Watts/cm$^2$. The dark conductivity was measured inside a light tight metal box. The data points labelled 130 identify the preferred Hydrogen/Silane ratio. The dashed line labelled 132 shows the resulting ratio of photo/dark conductivity with no He used (i.e., only hydrogen). The data points labelled 134 illustrate the resulting ratio of photo/dark conductivity with no hydrogen (only He) used. These data show that this novel low temperature PE CVD process is capable of depositing a-Si:H layers having semiconducting characteristics equivalent to those made by higher temperature PE CVD processes utilizing different gas mixtures and other process parameters.

In describing the foregoing novel low temperature PE CVD processes, it should be understood that the term substrate means a plastic substrate such as substrate 52 coated with polymeric encapsulation film 54, however, the substrate need not necessarily be limited to a plastic. It will also be understood that the processes may be applied to other structures, such as one where gate electrode 56 and gate dielectric 58 have previously been formed on substrate 52 coated with film 54. The PE CVD process does not form a part of this invention per se; that is the novel processes can be carried out in conventional PE CVD process equipment such as is described by Matsuda and Hata in Chapter 2 (Deposition Process and Growth Mechanism) of Glow-Discharge Hydrogenated Amorphous Silicon (K. Tanaka, ed.), Kluwer Academic Publishers which is incorporated herein by reference.

The novel low temperature PE CVD process described above can also be used to make other devices on plastic or other substrates. For example, active matrix displays can use a thin film metal/insulator/metal diode at each pixel instead of a TFT. The SiNitride PE CVD process of the invention can be used to make the insulator layer. In one embodiment of a light sensor array, an electrode/a-Si:H/electrode photosensitive resistor is used. The a-Si:H PE CVD process of the invention can be used to make the a-Si:H layer.

An alternative process for deposition of dielectric layers 58, 62, 78, 82, 100 and 104 is is Reactive Magnetron Sputtering using a Si target and suitable pressures of argon, nitrogen and hydrogen at about 125° C. as described by McCormick et al. in "An Amorphous Silicon Thin Film Transistor Fabricated at 125° C. by DC Reactive Magnetron Sputtering", Appl. Phys. Lett. 70(2), 13 Jan. 1997, pp. 226–227, which is incorporated herein by reference. An alternative process for deposition of amorphous Si layers 60, 80, and 102 is Reactive Magnetron Sputtering as described in the aforementioned Appl. Phys. Lett. technical article.

The invention is further illustrated by means of the following examples which are intended to be exemplary and not limiting of the invention.

EXAMPLE 1

Lexan polycarbonate (0.75 mm thick) from GE Plastics was coated at Metroline Company with the Vitrinite (TM)

coating. The coated substrates were cut into 5 cm ×5 cm squares, baked at 120° C. in an oven for 1 hour, placed in a plasma reactor and exposed to an Argon plasma for 20 minutes at a pressure of 0.4 Torr and 0.36 W/cm² power density, in order to improve adhesion to the Vitrinite coating. The coated substrates were then placed in a vacuum chamber and gate metal 56 was deposited by evaporation in 3 successive layers. In this example (as also in the next example), layer 56 was not patterned as was the case for the device of FIG. 2 where it appears as a metal line of width similar to the TFT size, but was a "blanket" layer over the entire substrate. This does not affect the electrical data, but makes the processing simpler. Next, a 200 Angstrom thick layer of chromium (adhesion layer) was deposited. Second, a 600 Angstrom thick layer of aluminum (conductivity layer) was deposited. Finally, a 200 Angstrom thick layer of chromium (adhesion layer) was deposited.

The substrates containing the gate metal were placed in a plasma chemical vapor deposition reactor, heated to 125° C., and layers 58, 60 and 62 were deposited in sequence without exposure to air. Gate dielectric 58 was deposited at a pressure of 0.6 Torr, for 25 minutes using an RF power density of 0.036 W/cm², and 13.6 MHz frequency, resulting in a film approximately 3,000 Angstroms thick. The gases and flow rates were silane (10 sccm), ammonia (15 sccm), nitrogen (250 sccm) and helium (600 sccm). The reactor was pumped out, and the a-Si:H layer 60 was deposited at a pressure of 1.0 torr for 15 minutes using 0.026 W/cm² power density, resulting in a film approximately 750 Angstroms thick. The gases and flow rates were silane (20 sccm), hydrogen (140 sccm) and helium (200 sccm). FIG. 6 shows the optimization to select the best $H_2$/Silane ratio, 7/1, to make the a-Si:H layer. The reactor was pumped out and encapsulation (etch stop) SiNitride layer 62 was deposited for 33 minutes using the same process described above for layer 58, resulting in a film approximately 4,000 Angstroms thick. The samples were cooled to room temperature in the reactor and removed. A first lithography step was performed to pattern the TFT source and drain vias. The substrate was spin coated with photoresist (Shipley 1813) by spinning at 3,000 rpm for 30 seconds. The photoresist (PR) was then cured at 90° C. in an oven for 20 minutes. The PR was patterned using a Karl Suss MJB-3 Aligner. The exposure time was 20 seconds and the light fluence was 9.5 mW/cm². The PR was developed for 60 seconds in Shipley MFP-321 developer, rinsed in deionized water (DW) and fully cured at 120° C. in an oven for 20 minutes. The source and drain vias were next etched in 1% Hydrofluoric acid (HF) for 60 seconds and the substrates were next rinsed in DW and dried. The PR was removed in an oxygen plasma ashing tool for 9 minutes using 0.1 Watt and 10 sccm oxygen flow.

Prior to deposition of the metal source and drain electrodes, the exposed surfaces of layer 60 were cleaned by placing the substrates in 0.1% HF for 20 seconds. The surfaces were blown dry with dry nitrogen, and immediately placed in a vacuum chamber. Metal source and drain layers 64 and 66 were deposited by evaporation. First, contact layer 64 (1,000 Angstroms of magnesium) was deposited then electrode layer 66 (1,500 Angstroms of aluminum) was deposited.

A second lithography step was performed to pattern the TFT source and drain electrodes, using the same procedure as in the first lithography step. Metal layers 64 and 66 were etched in Aluminum Etchant A from Transene Co. (Rowley, Mass.) for 45 seconds at 35° C. The PR was removed in an oxygen plasma for 9 minutes using 100 Watts and 10 sccm oxygen flow. The substrates were then rinsed for 30 minutes in flowing DW, blown dry, and baked in an oven at 120° C. for 30 minutes. The finished TFT's were then stored in a dry nitrogen ambient.

Figure 7A:
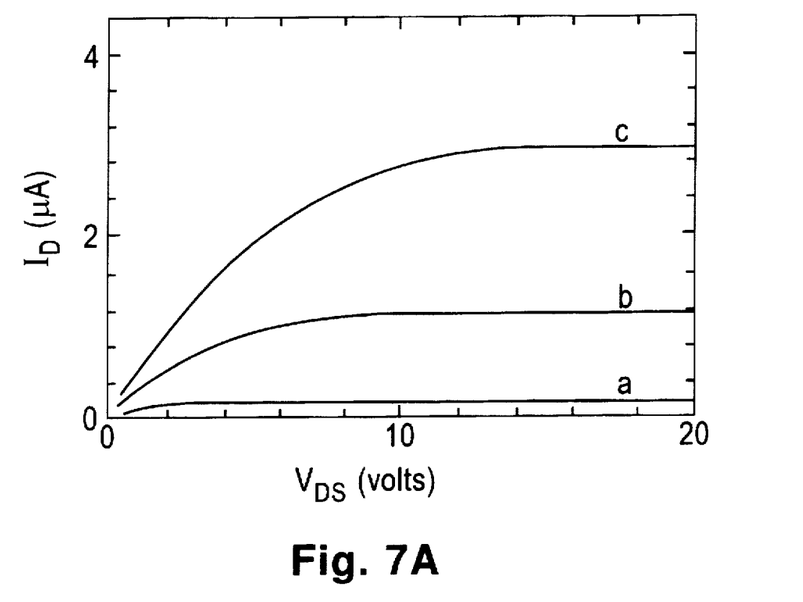
FIG. 7A is a graph of drain current ($I_D$) versus drain-source voltage ($V_{DS}$) for three values of gate voltage for a TFT according to FIG. 2.
Figure 7B:
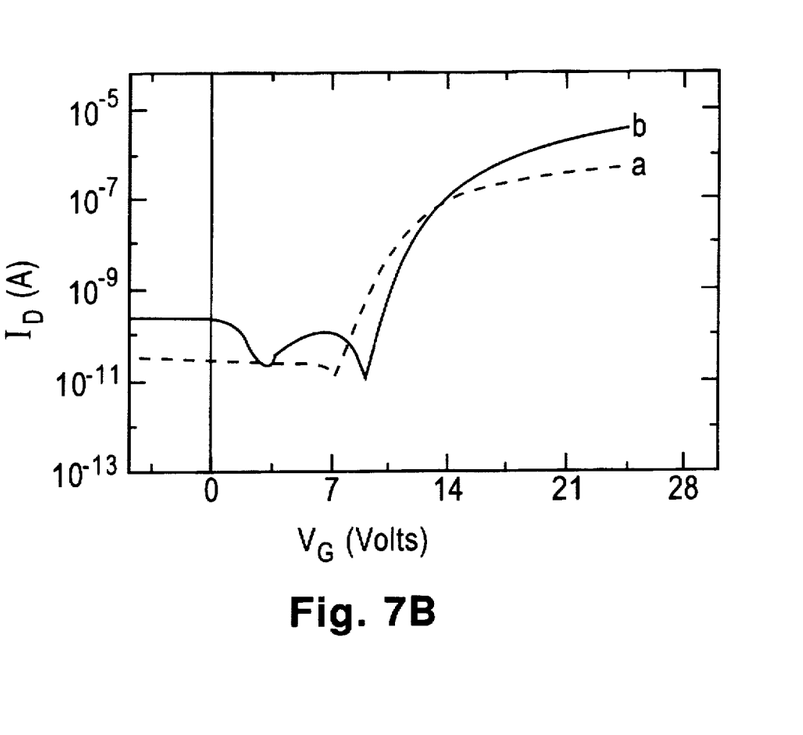
FIG. 7B is a graph of log drain current ($I_D$) versus gate voltage ($V_G$) for drain-source voltage ($V_{DS}$) equal to 1 volt (curve a) and 10 volts (curve b) for a TFT according to FIG. 2.

The electrical characteristics were measured using an HP 4145A Parameter Analyzer with the substrates on a probe station inside a metal box to exclude light. Typical characteristics are shown in FIGS. 7A and 7B for a TFT with width/length ratio of 7. FIG. 7A is a plot of the drain current ($I_D$) versus drain-source voltage ($V_{DS}$) for gate voltages of 15, 20 and 25 Volts (curves (a), (b) and (c), respectively). FIG. 7B is a plot of the drain current ($I_D$) on a logarithmic scale versus gate voltage ($V_G$) for $V_{DS}$ of 1 and 10 Volts. From these data, the TFT's of the invention on plastic are seen to exhibit typical TFT characteristics and a field effect mobility of 0.2 to 0.3 cm²/V s is estimated.

EXAMPLE 2

Lexan polycarbonate (0.75 mm thick) from GE Plastics was cut into 5 cm ×5 cm squares, washed with deionized water (DW) and soap and then rinsed in running DW. The substrates were further rinsed ultrasonically in DW 3 times, rinsed in isopropyl alcohol, and baked at 120° C. in an oven for 1 hour. The clean substrates were dipped in LHP100PM Primer (adhesion promoter) from GE Silicones, dried in air for 30 minutes, and baked at 120° C. for 1 hour. The substrates were then dipped in SHC1200 Hardcoat from GE Silicones, dried overnight in air and baked at 120° C. for 1 hour.

The coated substrates were then placed in a vacuum chamber and gate metal 56 was deposited by evaporation. First, 200 Angstroms of chromium (adhesion layer) was deposited. Second, 600 Angstroms of aluminum (for conductivity) was deposited. Finally, 200 Angstroms of chromium (adhesion layer) was deposited.

The substrates containing the gate metal were placed in a plasma chemical vapor deposition reactor, heated to 125° C., and layers 58, 60 and 62 were deposited in sequence without exposure to air. Gate dielectric 58 was deposited at a pressure of 0.6 torr, for 25 minutes using an RF power density of 0.036 W/cm², and 13.6 MHz frequency, resulting in a film approximately 3,000 Angstroms thick. The gases and flow rates were silane (10 sccm), ammonia (15 sccm), nitrogen (250 sccm) and helium (600 sccm).

The reactor was pumped out and the a-Si:H layer 60 was deposited at a pressure of 1.0 Torr, for 15 minutes using 0.026 W/cm² power density, resulting in a film approximately 750 Angstroms thick. The gases and flow rates were silane (20 sccm), hydrogen (140 sccm) and helium (200 sccm).

FIG. 6 shows the optimization to select the best $H_2$/Silane ratio, 7/1, to make the a-Si:H layer. The reactor was pumped out, and the encapsulation (etch stop) SiNitride layer 62 was deposited for 33 minutes using the same process described above for layer 58, resulting in a film approximately 4,000 Angstroms thick. The samples were then cooled to room temperature in the reactor and removed.

A first lithography step was performed to pattern the TFT source and drain vias. The substrate was spin coated with photoresist (Shipley 1813) by spinning at 3,000 rpm for 30 seconds, and the photoresist (PR) was then cured at 90° C. in an oven for 20 minutes. The PR was patterned using a Karl Suss MJB-3 Aligner. The exposure time was 20 seconds and the light fluence was 9.5 mW/cm². The PR was developed for 60 seconds in Shipley MFP-321 developer, rinsed in DW, and fully cured at 120° C. in an oven for 20 minutes. Source and drain vias were etched in 1% Hydrofluoric acid (HF) for 60 seconds and the substrates were rinsed in DW and dried. The PR was removed in an oxygen plasma ashing tool for 9 minutes using 0.1 Watt and 10 sccm Oxygen flow.

Prior to deposition of the metal source and drain electrodes, the substrates were dipped in 0.1% HF for 20 seconds, blown dry with dry nitrogen, and immediately placed in a vacuum chamber. Metal source and drain layers 64 and 66 are were deposited by evaporation. First, contact layer 64 (1,000 Angstroms of magnesium) was deposited then electrode layer 66 (1,500 Angstroms of aluminum) was deposited.

A second lithography step was performed to pattern the TFT source and drain electrodes using the same procedure as in the first lithography step. Metal layers 64 and 66 were etched in aluminum Etchant A from Transene Co. (Rowley, Mass.) for 45 seconds at 35° C. The PR was removed in an oxygen plasma for 9 minutes using 100 Watts and 10 sccm oxygen flow. The substrates were then rinsed for 30 minutes in flowing DW, blown dry and baked in an oven at 120° C. for 30 minutes. The finished TFTs were stored in a dry nitrogen ambient.

The electrical characteristics were measured as described above in the first example. The TFT characteristics were the same as those of FIG. 7A and 7B in the first example.

While this invention has been described in terms of preferred embodiments, it is apparent that one skilled in the art could adopt other forms. For example, other materials could be used or developed as substitutes for those noted, and different assembly techniques and procedures could be employed. Accordingly, the scope of my invention is to be limited only by the following claims.

What is claimed is:

1. A thin film transistor comprising:
    a) a substrate,
    b) a polymeric encapsulation film which covers said substrate,
    c) a gate electrode,
    d) a gate insulating layer,
    e) a semiconducting channel layer deposited on top of said gate insulating layer,
    f) an insulating encapsulation layer positioned on said channel layer,
    g) a source electrode,
    h) a drain electrode, and
    i) a contact layer situated beneath each of said source and drain electrodes and in contact with at least said channel layer
    wherein said substrate is a plastic having a low glass transition temperature.

2. The thin film transistor of claim 1 wherein said gate electrode is a metal.

3. The thin film transistor of claim 2 wherein said metal is one selected from the group comprising chromium, tantalum, molybdenum, tungsten, copper and alloys thereof.

4. The thin film transistor of claim 1 wherein said gate electrode is a tri-layer selected from the group comprising chromium/M/chromium and Ti/M/Ti where M is a metal selected from the group comprising chromium, tantalum, molybdenum, tungsten, copper and alloys thereof.

5. The thin film transistor of claim 1 wherein said gate dielectric is amorphous SiNitride.

6. The thin film transistor of claim 1 wherein said channel layer is amorphous silicon.

7. The thin film transistor of claim 1 wherein said insulating encapsulation layer is amorphous SiNitride.

8. The thin film transistor of claim 1 wherein said contact layer is an n-type semiconductor.

9. The thin film transistor of claim 8 wherein said n-type semiconductor is a-Si:H doped with phosphorus.

10. The thin film transistor of claim 1 wherein said contact layer is a low work function metal.

11. The thin film transistor of claim 1 further including a passivation layer over the top of said thin film transistor.

12. A planar array comprising a plurality of claim 1 thin film transistors.

13. A thin film transistor comprising:
    a) a substrate,
    b) a polymeric encapsulation film which covers said substrate,
    c) a gate electrode,
    d) a gate insulating layer,
    e) a semiconducting channel layer deposited on top of said gate insulating layer,
    f) a contact layer positioned over said channel layer and being discontinuous such that said contact layer consists of two sections,
    g) a source electrode in contact with one of said two sections of said contact layer,
    h) a drain electrode in contact with the other of said two sections of said contact layer, and
    i) an insulating encapsulation layer in contact with at least a part of said source electrode, said drain electrode, said channel layer and said contact layers,
    wherein said substrate is a plastic having a low glass transition temperature.

14. The thin film transistor of claim 13 wherein said gate electrode is a metal.

15. The thin film transistor of claim 14 wherein said metal is one selected from the group comprising chromium, tantalum, molybdenum, tungsten, copper and alloys thereof.

16. The thin film transistor of claim 13 wherein said gate electrode is a tri-layer selected from the group comprising chromium/M/chromium and Ti/M/Ti where M is a metal selected from the group comprising chromium, tantalum, molybdenum, tungsten, copper and alloys thereof.

17. The thin film transistor of claim 13 wherein said gate dielectric is amorphous SiNitride.

18. The thin film transistor of claim 13 wherein said channel layer is amorphous silicon.

19. The thin film transistor of claim 13 wherein said insulating encapsulation layer is SiNitride.

20. The thin film transistor of claim 13 wherein said contact layer is an n-type semiconductor.

21. The thin film transistor of claim 20 wherein said n-type semiconductor is a-Si:H doped with phosphorus.

22. The thin film transistor of claim 13 wherein said contact layer is a low work function metal.

23. The thin film transistor of claim 13 further including a passivation layer over the top of said thin film transistor.

24. A planar array comprising a plurality of claim 13 thin film transistors.

25. A thin film transistor comprising:
    a) a substrate,
    b) a polymeric encapsulation film which covers said substrate,
    c) a conducting gate layer,
    d) a protective layer over the top of said gate metal layer,
    e) a gate insulating layer,
    f) a semiconducting channel layer deposited on top of said gate insulating layer, g) an insulating encapsulation layer positioned on said channel layer said layer having two apertures therein.

h) a thin semiconductor layer positioned in each of said apertures and over a part of the top of said insulating encapsulation layer and coating the walls of said apertures and contacting said channel layer, i) a source electrode consisting of a conducting polymer deposited in one of said apertures and in contact with said thin contact layer, and j) a drain electrode consisting of a conducting polymer deposited in the other of said apertures and in contact with said thin semiconductor layer, wherein said substrate is a plastic having a low glass transition temperature.

26. The thin film transistor of claim 25 wherein said gate layer is a conducting polymer.

27. The thin film transistor of claim 26 wherein said conducting polymer is one selected from the group consisting of polyaniline, polyacetylene and polyphenylenevinylene.

28. The thin film transistor of claim 25 wherein said protective layer is a doped layer of n-type a-Si:H.

29. The thin film transistor of claim 25 wherein said protective layer is chromium.

30. The thin film transistor of claim 25 wherein said gate dielectric is amorphous SiNitride.

31. The thin film transistor of claim 25 wherein said channel layer is amorphous silicon.

32. The thin film transistor of claim 25 wherein said insulating encapsulation layer is amorphous SiNitride.

33. The thin film transistor of claim 25 wherein said contact layer is an n-type semiconductor.

34. The thin film transistor of claim 33 wherein said n-type semiconductor is a-Si:H doped with phosphorus.

35. The thin film transistor of claim 25 wherein said contact layer is a low work function metal.

36. The thin film transistor of claim 25 wherein the conducting polymer of said source electrode and said drain electrode is one selected from the group consisting of polyaniline, polyacetylene and polyphenylenevinylene.

37. The thin film transistor of claim 25 further including a passivation layer over the top of said thin film transistor.

38. A planar array comprising a plurality of claim 25 thin film transistors.

* * * * *